United States Patent
Katori et al.

[11] Patent Number: 6,043,561
[45] Date of Patent: Mar. 28, 2000

[54] ELECTRONIC MATERIAL, ITS MANUFACTURING METHOD, DIELECTRIC CAPACITOR, NON-VOLATILE MEMORY AND SEMICONDUCTOR DEVICE

[75] Inventors: Kenji Katori; Katsuyuki Hironaka; Koji Watanabe, all of Kanagawa, Japan

[73] Assignee: Sony Corporation, Tokyo, Japan

[21] Appl. No.: 09/065,445

[22] Filed: Apr. 24, 1998

[30] Foreign Application Priority Data

Apr. 28, 1997 [JP] Japan .................................. 9-110830

[51] Int. Cl.[7] .................................................. H01L 23/48
[52] U.S. Cl. ........................... 257/751; 257/298; 257/295; 257/310; 257/769
[58] Field of Search .................................. 257/295, 298, 257/310, 751, 769; 438/627, 643, 653, 927

[56] References Cited

U.S. PATENT DOCUMENTS

| | | | |
|---|---|---|---|
| 5,612,574 | 3/1997 | Summerfelt et al. | 257/783 |
| 5,790,366 | 8/1998 | Desu et al. | 361/305 |
| 5,825,609 | 10/1998 | Andricacos et al. | 361/321.4 |
| 5,932,907 | 8/1999 | Grill et al. | 257/310 |

FOREIGN PATENT DOCUMENTS

| | | |
|---|---|---|
| 0 415 751 A1 | 3/1991 | European Pat. Off. . |
| 0 697 720 A1 | 2/1996 | European Pat. Off. . |
| 195 15 347 A1 | 4/1995 | Germany . |

OTHER PUBLICATIONS

Bhatt et al., "Novel high temperature multilayer electrode-barrier structure for high-density ferroelectric memories", Appl. Phys. lett. 71 (5), p. 719–721, Aug. 4, 1997.

Primary Examiner—Tom Thomas
Assistant Examiner—Shouxiang Hu
Attorney, Agent, or Firm—Hill & Simpson

[57] ABSTRACT

It is intended to provide an electronic material which permits not only PZT but also SBT requiring high-temperature annealing to be used as the material of a dielectric film of a dielectric capacitor in vertical alignment with a transistor so as to connect the lower electrode of the dielectric capacitor to a diffusion layer of the transistor with a Si or W plug; its manufacturing method; and a ferroelectric capacitor and nonvolatile memory. There is also provided a semiconductor device permitting greater freedom in selecting the process temperature and time in a later step subsequent to formation of the plug. Used as the material of the lower electrode of the dielectric capacitor is a material expressed by the composition formula $Pd_a(Rh_{100-x-y-z}Pt_xIr_yRu_z)_bO_c$ where a, b, c, x, y and z are composition ratios in atomic %) in which the composition ratios satisfy $70 \geq a \geq 20$, $40 \geq b \geq 10$, $60 \geq c \geq 15$, $a+b+c=100$, $100 > x \geq 0$, $100 > y \geq 0$, $100 > z \geq 0$ and $100 > x+y+z \geq 0$. This material is also used as the material of a diffusion preventing layer interposed between the diffusion layer of the semiconductor device and the overlying plug.

29 Claims, 7 Drawing Sheets x(%) IN $(Pd_{100-x}Rh_x)_{60}O_{40}$

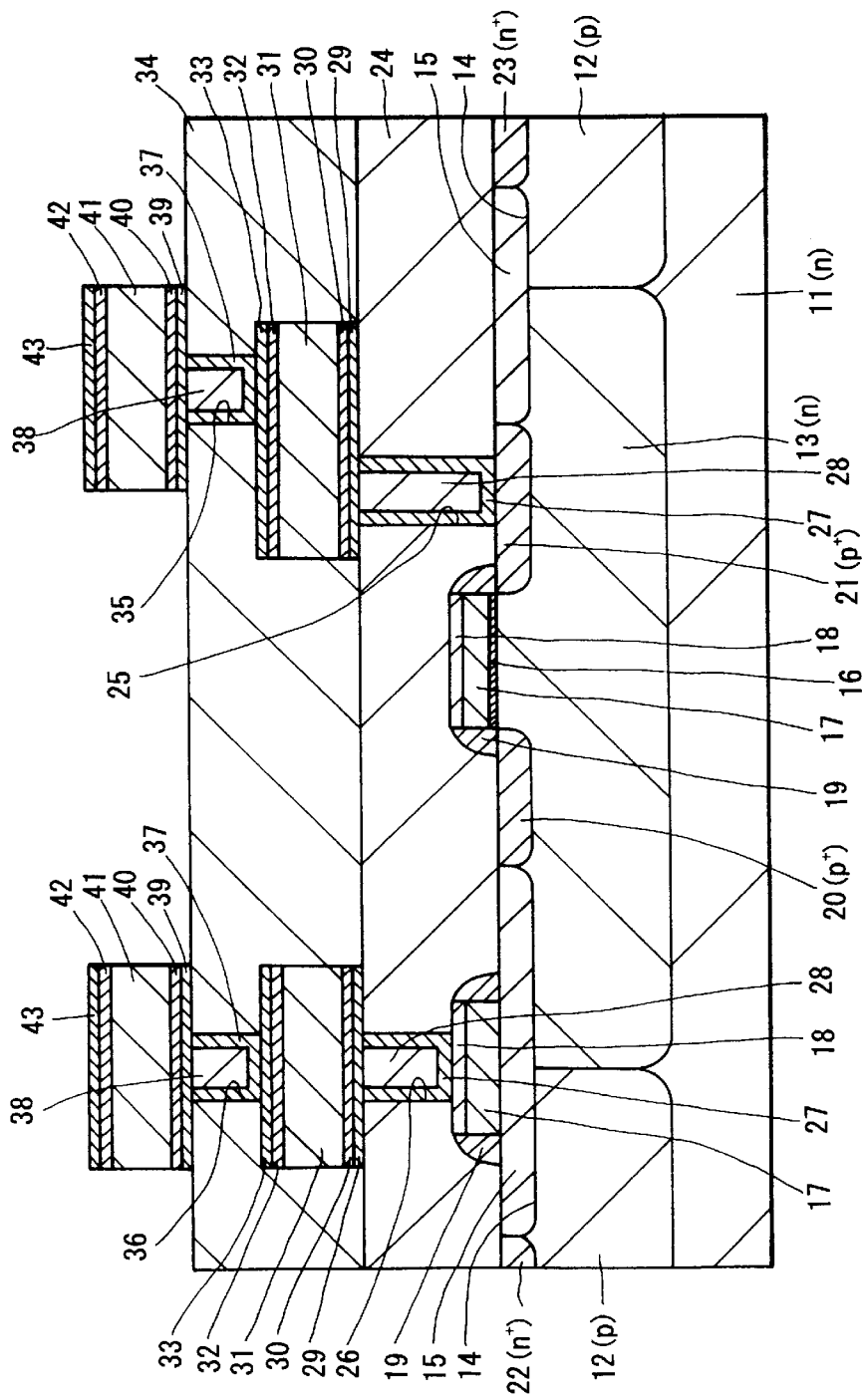

ELECTRONIC MATERIAL, ITS MANUFACTURING METHOD, DIELECTRIC CAPACITOR, NON-VOLATILE MEMORY AND SEMICONDUCTOR DEVICE

BACKGROUND OF THE INVENTION

1. Field of the Invention

This invention relates to an electronic material, its manufacturing method, dielectric capacitor, non-volatile memory and semiconductor device.

2. Description of the Related Art

Ferroelectric memory is non-volatile memory permitting high-speed rewriting utilizing high-speed polarization inversion and residual polarization of a ferroelectric film. An example of conventional ferroelectric memory is shown in FIG. 1.

As shown in FIG. 1, in the conventional ferroelectric memory, a field insulating film 102 is selectively formed on the surface of a p-type Si substrate 101 to separate devices. A gate insulating film 103 is formed on the surface of an active region surrounded by the field insulating film 102. Reference symbol WL denotes a word line. An $n^+$-type source region 104 and an $n^+$-type drain region 104 are formed in a p-type Si substrate 101 at opposite sides of the word line WL. The word line WL, source region 104 and drain region 105 form a transistor Q.

Numeral 106 denotes an inter-layer insulating film. Films are stacked sequentially on the inter-layer insulating film 106 above the field insulating film 102 via a Ti film 107, 30 nm thick, for example, as a bonding layer, which are, namely, a Pt film 108 with a thickness about 200 nm as the lower electrode, a ferroelectric film 109 made of Pb(Zr, Ti)$O_3$(PZT) or SrBi$_2$Ta$_2$O$_9$(SBT) with a thickness about 200 nm, and a Pt film 110 with a thickness about 200 nm as the upper electrode. The Pt film 108, ferroelectric film 109 and Pt film 110 form a capacitor C. The transistor Q and the capacitor C form a memory cell.

Numeral 111 denotes an inter-layer insulating film. A contact hole 112 is made to pass through the inter-layer insulating film 106 and the inter-layer insulating film 111 above the source region 104. Another contact hole 113 is made to pass through the inter-layer insulating film 111 above one end portion of the Pt film 108. Another contact hole 114 is made to extend through the inter-layer insulating film 111 above the Pt film 110. The source region 104 and the lower electrode of the capacitor C, namely, Pt film 108, are connected by a wiring line 115 through the contact holes 112 and 113. A wiring line 116 is connected to the upper electrode of the capacitor C, namely, Pt film 110 through the contact hole 114. Numeral 117 denotes a passivation film.

In the conventional ferroelectric memory shown in FIG. 1, the transistor Q and the capacitor C are arranged in a horizontal direction (in parallel to the substrate surface). However, in order to increase the information recording density of the ferroelectric memory, it is necessary to arrange the transistor Q and the capacitor C in a vertical direction (normal to the substrate surface). FIG. 2 shows an example employing such a vertical arrangement. In FIG. 2, elements identical to those of FIG. 1 are labelled with common numerals.

In FIG. 2, numerals WL1 through WL4 denote word lines, and 118 denotes an inter-layer insulating film. A contact hole 119 is made to pass through the inter-layer insulating film 118 above the drain region 105, and a bit line BL is connected to the drain region 105 of the transistor Q through the contact hole 119. Numerals 120 and 121 denote inter-layer insulating films. Another contact hole 122 is made through the inter-layer insulating film 121 above the source region 104, and a poly-crystalline Si plug 123 is embedded in the contact hole 122. The source region 104 of the transistor Q and the Pt film 108 used as the lower electrode of the capacitor C are electrically connected by the poly-crystalline Si plug 123.

To form the ferroelectric film 109, it is usually necessary to anneal it in an oxygen atmosphere at a high temperature about 600 to 800° C. for its crystallization. There occurs the problem that Si in the poly-crystalline Si plug 123 thermally diffuses into the Pt film 108 as the lower electrode of the capacitor C, which results in Si being oxidized along the surface of the Pt film 108 to make it electrically non-conductive or low-conductive, and in Si diffusing further into the ferroelectric film 109 to significantly deteriorate the characteristics of the capacitor C.

A report states that, when the material of the ferroelectric film 109 is PZT whose calcination temperature is around 600° C., a nitride compound film, such as TiN, can be used as a layer for preventing diffusion of Si (Extended Abstracts of Spring Meeting, 1995 of The Japan Society of Applied Physics, 30p-D-20, 30p-D-10). However, considering that a nitride compound film is oxidized and loses the electric conductivity when annealed in an oxygen atmosphere at a high temperature, if a higher temperature is applied during annealing by introducing sufficient oxygen into the annealing atmosphere for the purpose of improving the ferroelectric characteristics of the ferroelectric film 109, then it causes surface coarseness by oxidization or an increase in electric resistance.

On the other hand, when SBT, believed to be more excellent in fatigue characteristics than PZT, is used as the material of the ferroelectric film 109, the annealing temperature for obtaining acceptable ferroelectric characteristics is as higher as 800° C. than PZT. Therefore, when SBT is used as the material of the ferroelectric film 109, the diffusion preventing layer made of the nitride compound mentioned above has an insufficient heat resistivity, and cannot be used.

Heretofore, no capacitor structure of a stacked type using SBT as the material of the ferroelectric film 109 has been reported, and it has been believed difficult to realize high-integrated non-volatile memory using such capacitors.

Additionally, the above-indicated problems may occur also when a W plug is used instead of poly-crystalline Si plug.

On the other hand, there is a ultra-high integrated semiconductor integrated circuit device having a multi-layered wiring structure whose minimum patterning size is 0.50 to 0.35 µm as shown in FIG. 3 (for example, Nikkei Microdevice, 1994 July, pp. 50–57 and Nikkei Microdevice, 1995 September, pp. 70–77).

As shown in FIG. 3, this conventional semiconductor integrated circuit device has formed p-wells 202 and n-wells 203 in an n-type Si substrate 201. The n-type Si substrate 201 has a recess 204 in the region to be used as the device separating region along its surface, and a field insulating film 205 made of SiO$_2$ is embedded in the recess 204. Along the surface of the active region surrounded by the field insulating film 205, a gate insulating film 206 made of SiO$_2$ is formed. Numeral 207 denotes a poly-crystalline Si film, and 208 denotes a metal silicide film such as WSi$_x$ film. These poly-crystalline Si film 207 and metal silicide film 208 form a polycide-structured gate electrode. Formed on side walls of these poly-crystalline Si film 207 and metal silicide film 208 is a side wall spacer 209 made of SiO$_2$. In each n-well 203, p$^+$-type diffusion layers 210 and 211 used as the source region or drain region are formed in self alignment with the gate electrode composed of the poly-crystalline Si film 207 and the metal silicide film 208. These gate electrode and diffusion layers 210, 211 form a p-channel MOS transistor. Similarly, an n-channel MOS transistor is formed in each p-well 202. Numerals 212 and 213 denote n$^+$-type diffusion layers used as the source region or drain region of the n-channel MOS transistor.

An inter-layer insulating film 214 is formed to cover the p-channel MOS transistor and the n-channel MOS transistor. The inter-layer insulating film 214 has formed via holes 215 and 216 at the portion aligned with the diffusion layer 211 of the p-channel MOS transistor and the portion aligned with the gate electrode on the field insulating film 205. W plugs 219 are embedded in the via holes 215 and 216 via Ti films 217 and TiN films 218.

An Al—Cu alloy wiring 222 overlie the via holes 215, 216 via a Ti film 220 and a TiN film 221, and a TiN film 223 is formed on the Al—Cu alloy wiring 222. Numeral 224 denotes an inter-layer insulating film. The inter-layer insulating film 224 has formed via holes 225, 226 in locations above the Al—Cu alloy wiring 222. Embedded in the via holes 225, 226 are W plugs 229 via a Ti film 227 and a TiN film 228.

An Al—Cu alloy wiring 232 overlies the via holes 225, 226 via a Ti film 230 and a TiN film 231, and a TiN film 233 is formed thereon.

In the semiconductor integrated circuit device shown in FIG. 3, the TiN film 217 (typically 5 to 50 nm thick) formed on the diffusion layer 211 in the location for the via hole 215 is used mainly for good electric connection of the W plug 219 with the diffusion layer 211 and for improvement of its adhesivity to the underlying layer, because, since the surface of the diffusion layer 211 is chemically active, and when it is exposed to moisture or atmospheric air, a thin SiO$_x$ film about 0.5 to 5 nm is formed along the surface in a very short time (presumably less than two to three minutes), and degrades the electric connection and the adhesivity to the diffusion layer 211. In contrast, when the Ti film 217 is formed on the diffusion layer 211, the Ti film 217 chemical reacts on the SiO$_x$ film on the surface of the diffusion layer 211, and results in improving the electric connection and the mechanical adhesivity.

However, when the W plug 219 (typically 50 to 700 nm thick) is formed on the diffusion layer 211 via the TiN film 217, chemical reaction occurs between Si in the diffusion layer 211 and the W plug 219 to form WSi$_x$ during annealing for making the W plug 219 (typically at 300 to 500° C.) or later annealing (typically at 350 to 450° C.). As a result, transportation of substance occurs (mainly, Si moves from the diffusion layer 211 into the W plug 219), and makes a gap between the diffusion layer 211 and the W plug 219, which causes insufficient electric connection there. On account of this problem, in order to prevent chemical reaction between the diffusion layer 211 and the W plug 219, the TiN film 218 (typically 5 to 50 nm thick) is inserted between the Ti film 217 and the W plug 219. Therefore, the TiN film 218 is called a barrier metal. In addition to the TiN film, also a TiON film is an example of the barrier metal.

The TiN film 220 formed on the W plug 219 is used for good electric connection and mechanical connection between the W plug 219 and the Al—Cu alloy wiring 222. The TiN film 221 on the Ti film 220 is used for reducing transportation of substances between the W plug 219 and the Al—Cu alloy wiring 222 and their chemical reaction. This is so for the Ti film 230 and the TiN film 231 formed on the W plugs 229 at locations of the via holes 225, 226.

However, upon manufacturing the semiconductor integrated circuit device mentioned above, if the W plug 219 is formed via the TiN film 217 and the TiN film 218, the maximum processing temperature in later steps is limited below the heat-resistant temperature of the TiN film 218. Since the heat resistant temperature of the TiN film 218 is as low as 500° C. (when made by sputtering) to 650° C. (when made by CVD), there is little room for choice regarding a process temperature and time. This problem occurs also when a Si plug or Al plug is used in lieu of the W plug 219.

As reviewed above, it has been difficult to use SBT requiring high-temperature annealing as the material of the ferroelectric film 109 of the capacitor C in a device, such as the conventional ferroelectric memory shown in FIG. 2, using vertical arrangement of the transistor Q and the capacitor C and connecting the lower electrode of the capacitor C, namely the Pt film 108, to the source region 104 of the transistor Q by the poly-crystalline Si plug 123 or W plug.

Additionally, in the conventional semiconductor integrated circuit device shown in FIG. 3, there has been little room for choice regarding the process temperature and time in later steps after formation of the W plug 219.

OBJECTS AND SUMMARY OF THE INVENTION

It is therefore an object of the invention to provide an electronic material-suitable for use as a lower electrode of a dielectric capacitor to be connected to a diffusion layer of a transistor by a plug made of Si or W in a device in which the transistor and the dielectric capacitor are arranged in a vertical arrangement; a manufacturing method of the electronic material; a dielectric capacitor having a lower electrode made of the electronic material so that not only PZT but also SBT, or the like, requiring high-temperature annealing can be used as the material of the dielectric film of the dielectric capacitor; and non-volatile memory using the dielectric capacitor.

Another object of the invention is to provide a semiconductor device permitting ample room for choice regarding the processing temperature and time after formation of a plug during fabrication of a semiconductor device, such as semiconductor integrated circuit device.

To solve the problems involved in the conventional technologies, the Inventor made researches and studies based on a number of experiments that are outlined below.

The Inventor first remarked Pd as a candidate of the material of the lower electrode of a dielectric capacitor. However, lower electrodes made of Pd alone cannot prevent diffusion of Si, and are liable to peel off from a Si substrate, for example, due to insufficient adhesivity. Additionally, when a SBT film, for example, is formed on the lower electrode made of Pd alone, and then annealed for crystallization, the surface of the SBT film becomes rough, presumably because the lower electrode made of Pd is partly oxidized during annealing, and changes in volume.

The Inventor progressed researches, and has found that the drawbacks can be removed by using a Pd—O compound material prepared by introducing oxygen to Pd as the material of the lower electrode. That is, by making the lower electrode by a Pd—O compound material, diffusion of Si can be prevented, and the adhesivity to a Si substrate, or the like, can be improved to prevent peeling-off. Additionally, when a SBT film is formed on the lower electrode made of the Pd—O compound material, the surface of the SBT film can be maintained smooth even after annealing for crystallization.

After subsequent studies, however, it has been found that Pd—O compound materials have a high specific resistance. Then, further studies were made and resulted in finding that the drawback of a high resistivity can be removed by using a Pd—Rh—O compound material prepared by introducing Rh into the Pd—O compound material.

FIG. 4 shows changes in resistivity with composition x in $(Pd_{100-x}Rh_x)_{60}O_{40}$ (composition in atomic %). It is known from FIG. 4 that, the Pd—O compound material (when x=0) has a high resistivity, it can be decreased by introducing Rh into the Pd—O compound material. In this case, in order to decrease the resistivity sufficiently, x is preferably 16% or more (2000 $\mu\Omega$cm or less in resistivity), and 10 atomic % or more in Rh composition in Pd—Rh—O.

On the other hand, introduction of too much Rh results in shifting the hysteresis curve of the SBT film, for example, as shown in FIG. 5. The Inventor measured hysteresis curves of a dielectric capacitor prepared by forming a SBT film by sol-gel spin coating on a lower electrode made of $(Pd_{100-x}Rh_x)_{60}O_{40}$ on a an n$^+$-type Si substrate whose resistivity is 0.003 $\Omega$cm, then annealing it in an oxygen atmosphere at 800° C. for one hour for crystallization, forming a Pt film as the upper electrode by sputtering, and again annealing it at 800° C., and reviewed changes in shift amount of residual polarization of $P_r$ with composition x in $(Pd_{100-x}Rh_x)_{60}O_{40}$, namely, changes in difference between $P_r^+$ and $P_r^-$, that is, $(P_r^+-P_r^-)$. Its result is shown in FIG. 6. It is known from FIG. 6 that, from the view point of ensuring an amply small shift amount of the residual polarization $P_r$, x is preferably 66% or less (2 $\mu$C/cm$^2$ or less in $P_r^+-P_r^-$), and 40 atomic % or less in composition of Rh in Pd—Rh—O.

FIG. 7 shows a result of a review on changes in shift amount of residual polarization $P_r$, that is, $(P_r^+-P_r^-)$ with composition z in $(Pd_{70}Rh_{30})_{100-z}O_z$ through measurement of hysterisis curves of a dielectric capacitor prepared by forming a SBT film on a lower electrode made of $(Pd_{70}Rh_{30})_{100-z}O_z$ on an n$^+$-type Si substrate having the resistivity of 0.003 $\Omega$cm in the same manner as explained above, then annealing it, forming a Pt film as the upper electrode, and again annealing it. It is known from FIG. 7 that, in this case, from the view point of ensuring an amply small shift amount of the residual polarization $P_r$, z is preferably 60 atomic % or less (2 $\mu$C/cm$^2$ or less in $P_r^+-P_r^-$). Maintaining z not more than 60 atomic % is desirable also from the viewpoint of amply decreasing the resistivity.

FIG. 8 shows a result of a review on changes in surface roughness $R_{a\ max}$ with composition z in $(Pd_{70}Rh_{30})_{100-z}O_z$ by measuring the surface condition of a SBT film prepared by stacking the SBT film on a lower electrode made of $(Pd_{70}Rh_{30})_{100-z}O_z$ on an n$^+$-type Si substrate having the resistivity of 0.003 $\Omega$cm in the same manner as explained above. It is known from FIG. 8 that, in this case, from the viewpoint of maintaining the surface roughness of the SBT film amply small, z is preferably 15 atomic % or less (about 4 nm or less in $R_{a\ max}$).

Although the above review has been made on Pd—Rh—O compound materials, equivalent characteristics can be obtained also with materials prepared by replacing part of Pd—Rh—O compound materials with one of more noble metal elements Pt, Ir and Ru.

The present invention has been made on the basis of the above-mentioned knowledge of the Inventor obtained through various experiments.

That is, according to a first invention, there is provided an electronic material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, a+b+c=100, 100>x$\geq$0, 100>y$\geq$0, 100>z$\geq$0, and 100>x+y+z$\geq$0.

According to a second invention, there is provided an electronic material expressed by the composition formula $Pd_aRh_bO_c$ (where a, b and c are composition ratios in atomic %) in which the composition ratios satisfy $70 \geq a \geq 20$, $40 \geq b \geq 10$, $60 \geq c \geq 15$ and a+b+c=100).

According to a third invention, there is provided a method for manufacturing an electronic material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, a+b+c=100, 100>x$\geq$0, 100>y$\geq$0, 100>z$\geq$0, and 100>x+y+z$\geq$0, comprising the step of:

forming a film of the electronic material by reactive sputtering using oxygen or water vapor.

According to the fourth invention, there is provided a dielectric capacitor comprising:

a lower electrode made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, a+b+c=100, 100>x$\geq$0, 100>y$\geq$0, 100>z$\geq$0, and 100>x+y+z$\geq$0;

a dielectric film on the lower electrode; and an upper electrode on the dielectric film.

According to a fifth invention, there is provided a non-volatile memory including a transistor and a dielectric capacitor, the dielectric capacitor comprising:

a lower electrode made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, a+b+c=100, 100>x$\geq$0, 100>y$\geq$0, 100>z$\geq$0, and 100>x+y+z$\geq$0;

a dielectric film on the lower electrode; and an upper electrode on the dielectric film.

According to a sixth invention, there is provided a semiconductor device including a first conductive layer and a second conductive layer on the first conductive layer, comprising:

a diffusion preventing layer interposed between the first conductive layer and the second conductive layer and made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, a+b+c=100, 100>x$\geq$0, 100>y$\geq$0, 100>z$\geq$0, and 100>x+y+z$\geq$0.

In the present invention, the composition ratio of the material expressed by $Pd_a(Rh_{100-x-y-z}Pt_xIr_yRu_z)_bO_c$ are in the range substantially same as the hatched region in FIG. 9. 0043

In the present invention, the composition ratios of the material expressed by $Pd_a(Rh_{100-x-y-z}Pt_xIr_yRu_z)_bO_c$ preferably satisfy $60 \geq a \geq 30$, $30 \geq b \geq 15$, $50 \geq c \geq 30$, and a+b+c=100.

In the fourth and fifth inventions, typically used as the material of the dielectric material is a Bi layer-structured perovskite-type ferroelectric material, namely, a ferroelectric material in which at least 85% is occupied by a crystal layer expressed by the composition formula $Bi_x(Sr, Ca, Ba)_y(Ta, Nb)_2O_2$ (where $2.50 \geq x \geq 1.70$, $1.20 \geq y \geq 0.60$, $z=9\pm d$ and $1.0 \geq d \geq 0$) (a slight amount of Bi and Ta, or Nb oxide or composite oxide may be contained), and a ferroelectric material in which at least 85% is occupied by a crystal layer expressed by the composition formula $Bi_xSr_yTa_2O_z$ (where $2.50 \geq x \geq 1.70$, $1.20 \geq y \geq 0.60$, $z=9\pm d$ and $1.0 \geq d \geq 0$) (a slight amount of Bi and Ta, or Nb oxide or composite oxide may be contained). The latter is represented by $SrBi_2Ta_2O_9$. Also usable as the material of the dielectric film is a ferroelectric material expressed by $Pb(Zr, Ti)O_3$. These ferroelectric materials are suitable for use as the material of a ferroelectric film of ferroelectric memory. Also usable as the material of the dielectric film is a high dielectric material expressed by $(Ba, Sr)TiO_3(BST)$, and this is suitable as the material of a dielectric film of a capacitor in DRAM, for example.

In the nonvolatile memory according to the fifth invention, when the transistor and the dielectric capacitor are located in vertical alignment for higher integration, the lower electrode is typically formed on the Si or W plug on the diffusion layer of the transistor.

According to the first and second inventions having the above-described constructions, an electronic material suitable for use as the material of the lower electrode or a diffusion preventing layer of a dielectric capacitor can be provided.

According to the third invention having the above-described construction, a high-quality electronic material suitable for use as the material of the lower electrode or a diffusion preventing layer of a dielectric capacitor can be manufactured easily.

According to the fourth and fifth inventions having the above-described constructions, the material expressed by the composition formula $Pd_a(Rh_{100-x-y-z}Pt_xIr_yRu_z)_bO_c$ to form the lower electrode of the dielectric capacitor has a much higher heat resistance than TiN, or the like, and can prevent diffusion of Si, etc. even under a high temperature. Therefore, in a structure using vertical alignment of a transistor and a dielectric capacitor so as to connect the lower electrode of the dielectric capacitor to a diffusion layer of the transistor with a Si or W plug, it can prevent diffusion of Si or W from the plug into the lower electrode even when the structure is annealed at a high temperature in an oxygen atmosphere for crystallization of a dielectric film. As a result, it overcomes the problems that Si or W diffusing and oxidized along the upper surface of the lower electrode degrades the electric conductivity, and that Si or W further diffuses into the dielectric film and thereby deteriorates the capacitor characteristics.

According to the sixth invention having the above-described construction, the material expressed by the composition formula $Pd_a(Rh_{100-x-y-z}Pt_xIr_yRu_z)_bO_c$ to form the diffusion preventing layer interposed between the first conductive layer and the second conductive layer has a much higher heat resistance than TiN, or the like, and can prevent diffusion of Si, etc. even under a high temperature.

The above, and other, objects, features and advantage of the present invention will become readily apparent from the following detailed description thereof which is to be read in connection with the accompanying drawings.

BRIEF DESCRIPTION OF THE DRAWINGS

FIG. 12 is a cross-sectional view of a semiconductor integrated circuit device according to the second embodiment of the invention.

DETAILED DESCRIPTION OF THE PREFERRED EMBODIMENTS

Explained below are embodiments of the invention with reference to the drawings.

Figure 1:
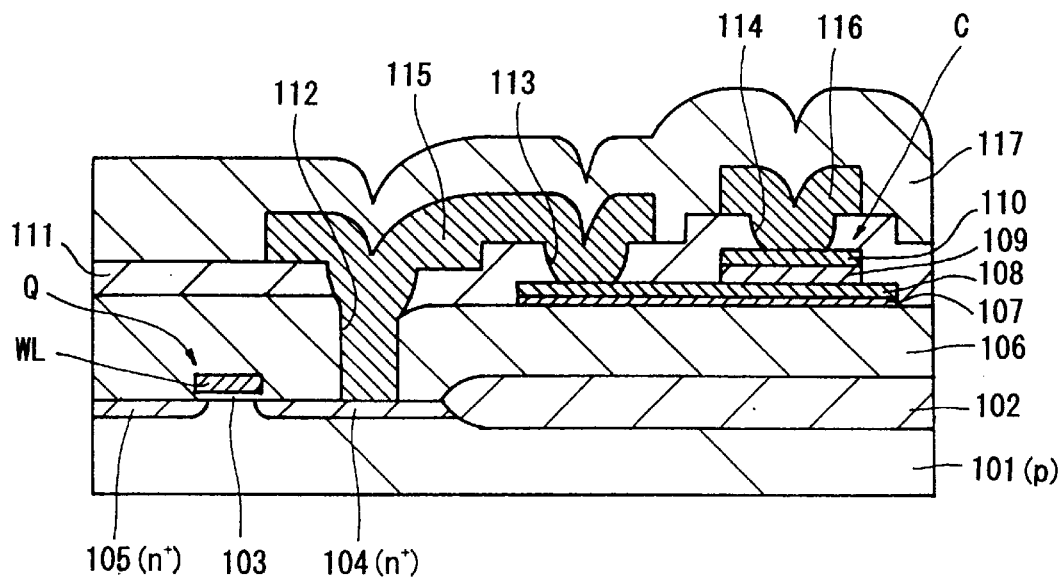
FIG. 1 is a cross-sectional view of conventional ferroelectric memory using horizontal alignment of a transistor and a capacitor.
Figure 2:
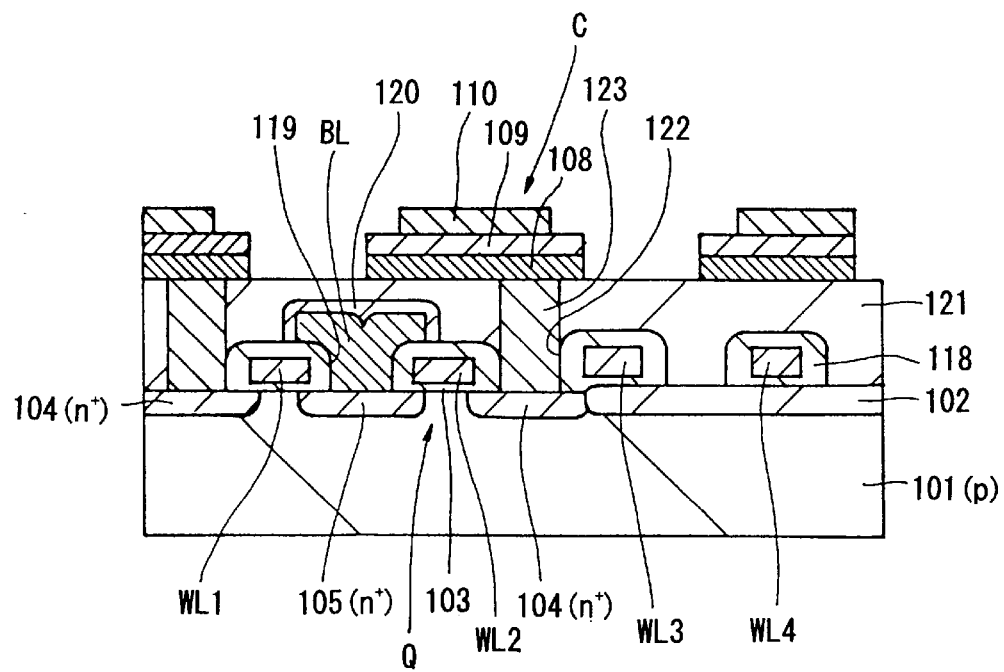
FIG. 2 is a cross-sectional view of conventional ferroelectric memory using vertical alignment of a transistor and a capacitor.
Figure 3:
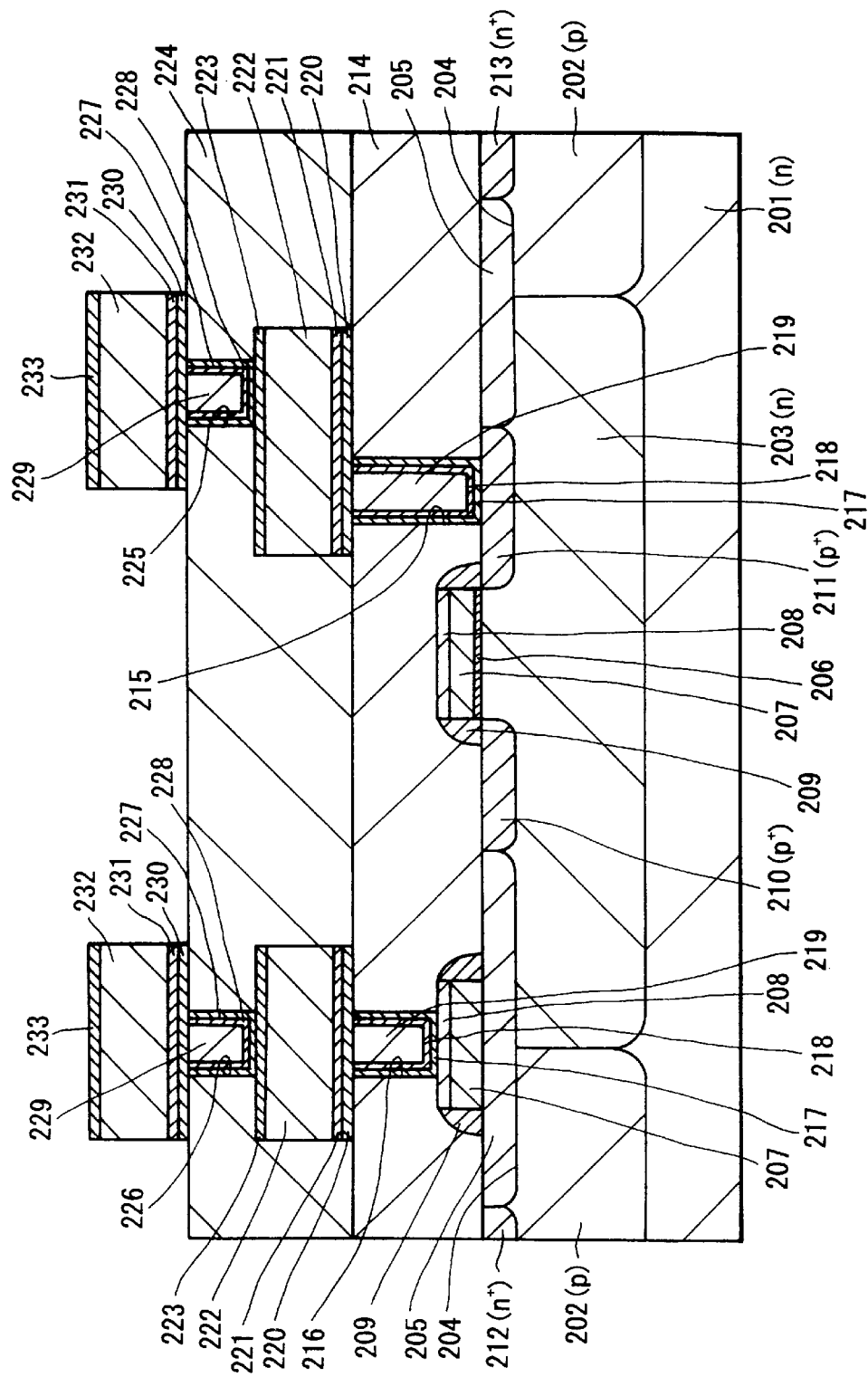
FIG. 3 is a cross sectional view of a conventional semiconductor integrated circuit device.
Figure 4:
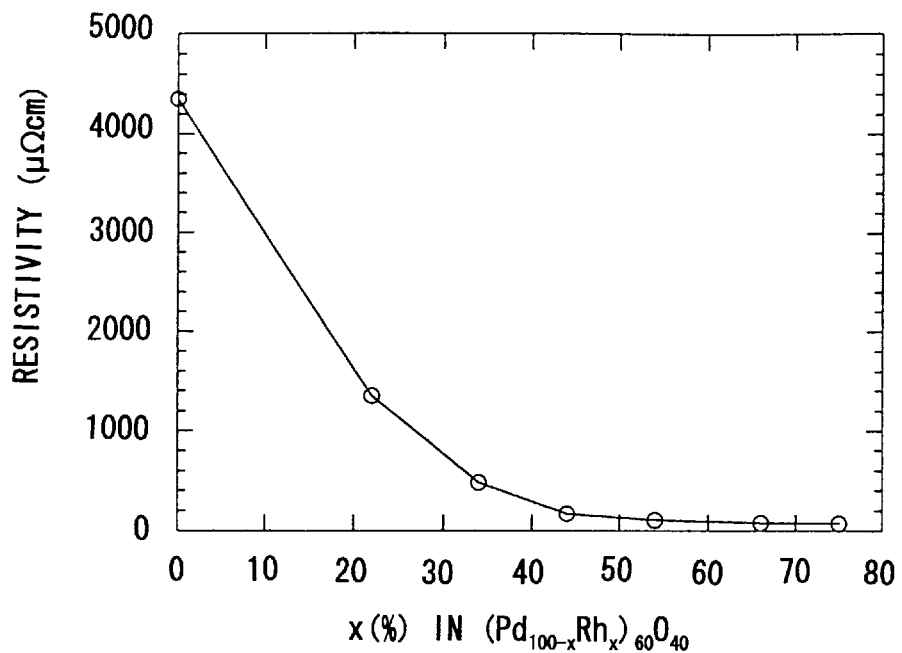
FIG. 4 is a schematic diagram showing a result of measurement of changes in resistivity with composition x in $(Pd_{100-x}Rh_x)_{60}O_{40}$.
Figure 5:
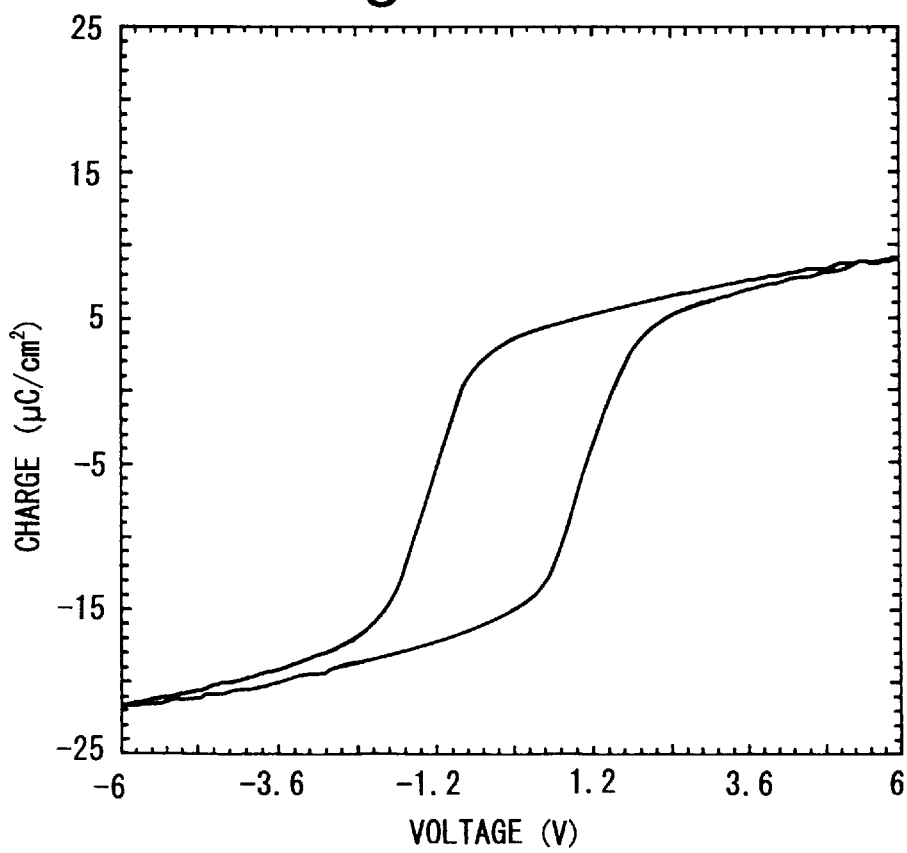
FIG. 5 is a schematic diagram showing a result of measurement of the amount of accumulated charge in a dielectric capacitor using a lower electrode made of $(Pd_{100-x}Rh_x)_{60}O_{40}$.
Figure 6:
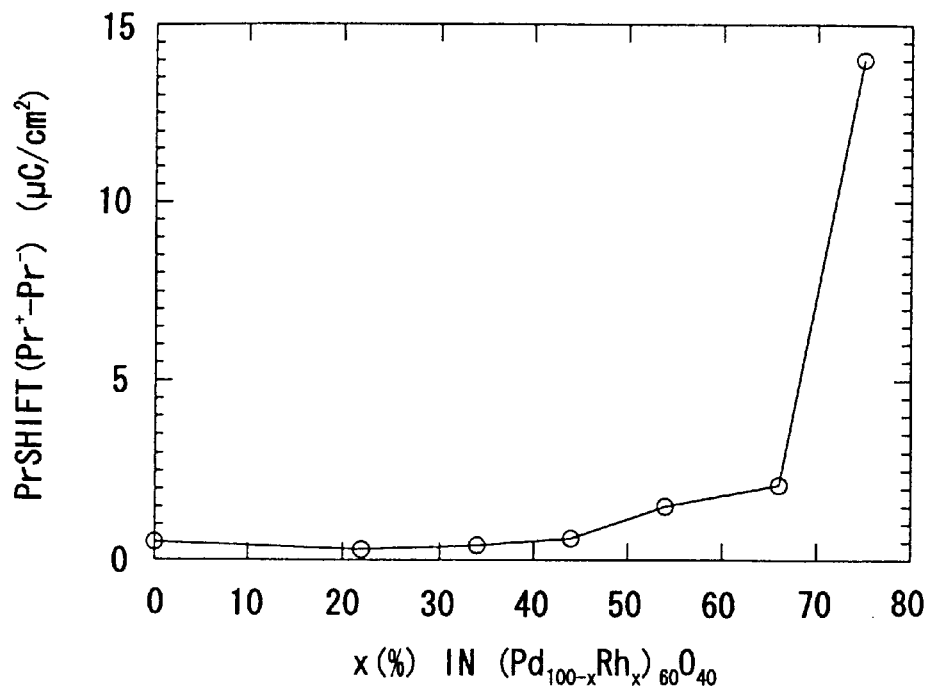
FIG. 6 is a schematic diagram showing a result of review of changes in shift amount of residual polarization $P_r$ with composition x in $(Pd_{100-x}Rh_x)_{60}O_{40}$.
Figure 7:
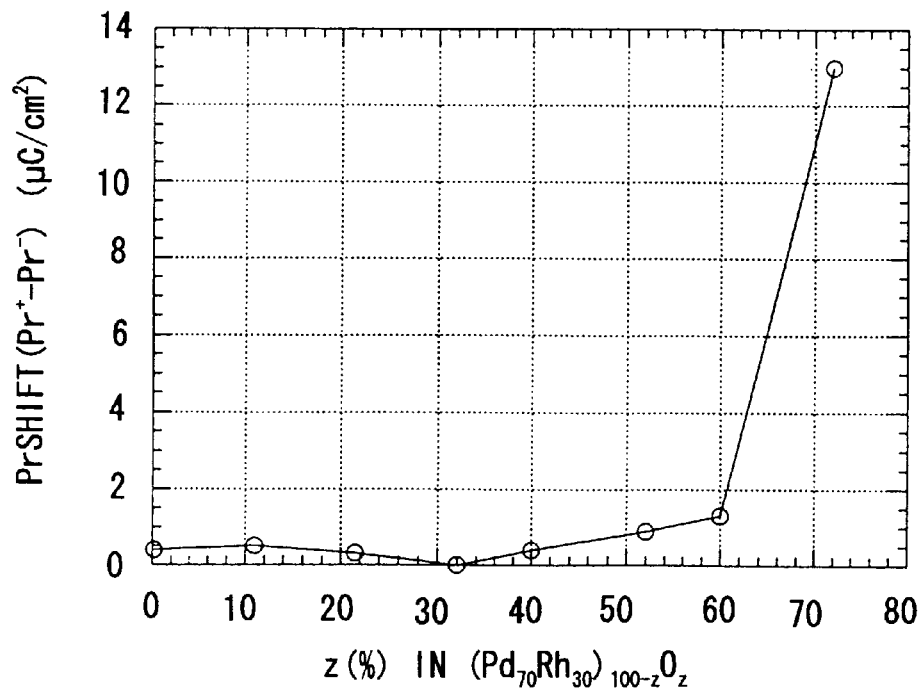
FIG. 7 is a schematic diagram showing a result of review of changes in shift amount of residual polarization $P_r$ with composition z in $(Pd_{70}Rh_{30})_{100-z}O_z$.
Figure 8:
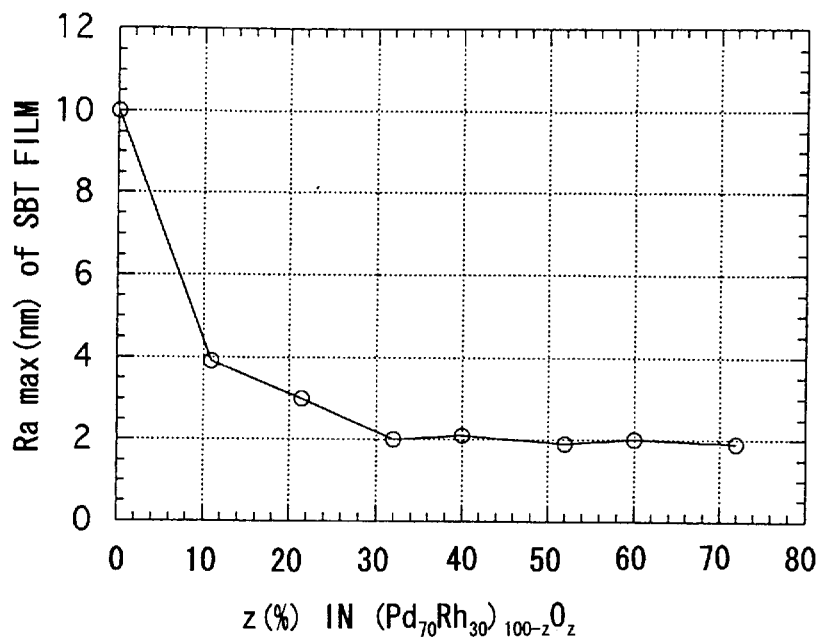
FIG. 8 is a schematic diagram showing a result of review of changes in surface roughness of a SBT film with composition z in $(Pd_{70}Rh_{30})_{100-z}O_z$.
Figure 9:
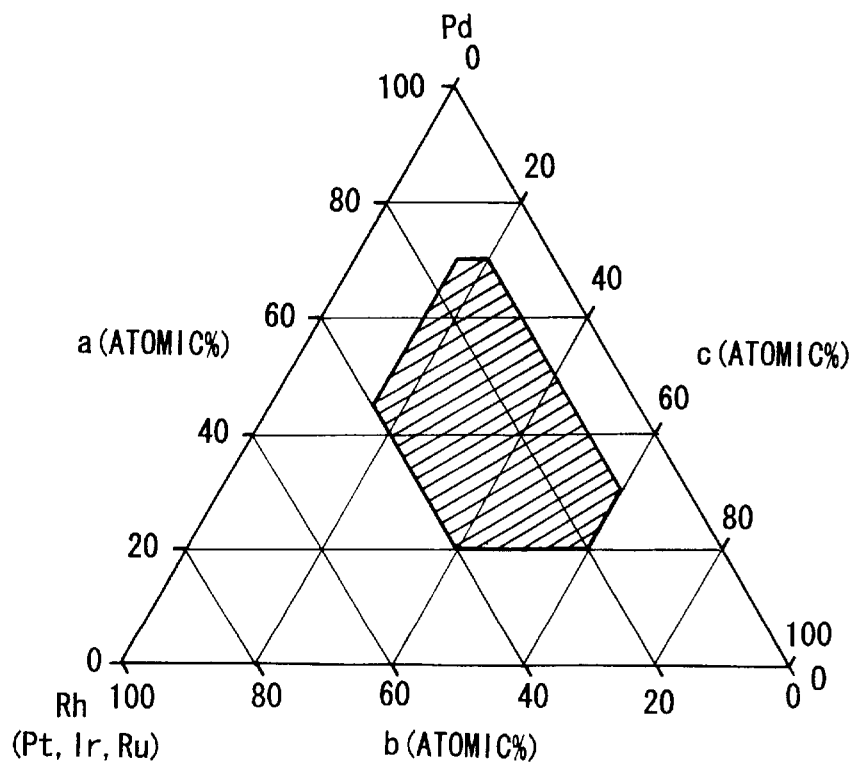
FIG. 9 is a schematic diagram showing the range of composition of $(Ph_{100-x-y-z}Pt_xIr_yRu_z)_bO_c$ or $Pd_aRh_bO_c$.
Figure 10:
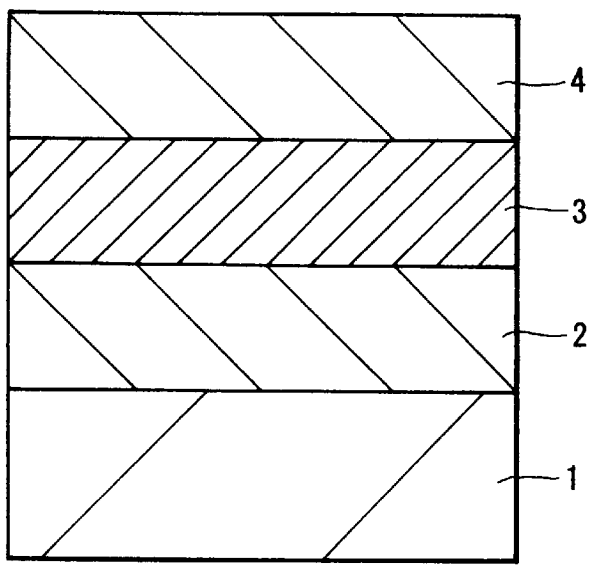
FIG. 10 is a cross-sectional view of a dielectric capacitor according to the first embodiment of the invention.

FIG. 10 shows a dielectric capacitor taken as a first embodiment of the invention. As shown in FIG. 10, the dielectric capacitor according to the first embodiment includes a $Pd_aRh_bO_c$ film 2 as its lower electrode, SBT film 3 as a ferroelectric film and a Pt film 4 as its upper electrode stacked in this sequence on a conductive Si substrate 1. Each of the $Pd_aRh_bO_c$ film 2, SBT film 3 and Pt film 4 has a thickness of about 200 nm, for example. Composition of the $Pd_aRh_bO_c$ film 2 is chosen to satisfy $70 \geq a \geq 20$, $40 \geq b \geq 10$, $60 \geq c \geq 15$, and $a+b+c=100$, that is, to enter in the hatched region in FIG. 9.

Next explained is a method for manufacturing the dielectric capacitor according to the first embodiment having the above construction.

To fabricate the dielectric capacitor according to the first embodiment, a si substrate 1 is processed by diluted hydrofluoric acid to remove a $SiO_x$ film (not shown) from its surface, and a $Pd_aRh_bO_c$ film 2 is formed on the Si substrate 1 by reactive sputtering. The $Pd_aRh_bO_c$ film 2 is used as the lower electrode. Exemplary conditions for forming the $Pd_aRh_bO_c$ film 2 are using a DC magnetron sputtering apparatus, using as the target a Pd target with the diameter of 100 mm on which eight Rh chips sized 10 mm×100 mm are put, using as the sputtering gas a mixed gas of Ar and $O_2$, the flow rate being 23 SCCM and 7 SCCM, respectively, total pressure being 1.5 mTorr, applied power being DC 0.4 A, 550 V, and the film making speed being 200 nm/13 minutes. Composition of the $Pd_aRh_bO_c$ film 2 thus made was proved to be $Pd_{42}Rh_{18}O_{40}$ (composition in atomic %) through analysis by EPMA.

Next formed is a SBT film 3 on the $Pd_aRh_bO_c$ film 2 by, for example, sol-gel spin coating. After that, the product is annealed at 800° C. for one hour in an oxygen atmosphere for crystallization of the SBT film 6, and a Pt film 4 is formed thereon by sputtering using a metal mask, for example. The Pt film 4 is used as the upper electrode. After that, the product is again annealed at 800° C. for one hour in an oxygen atmosphere.

Figure 11:
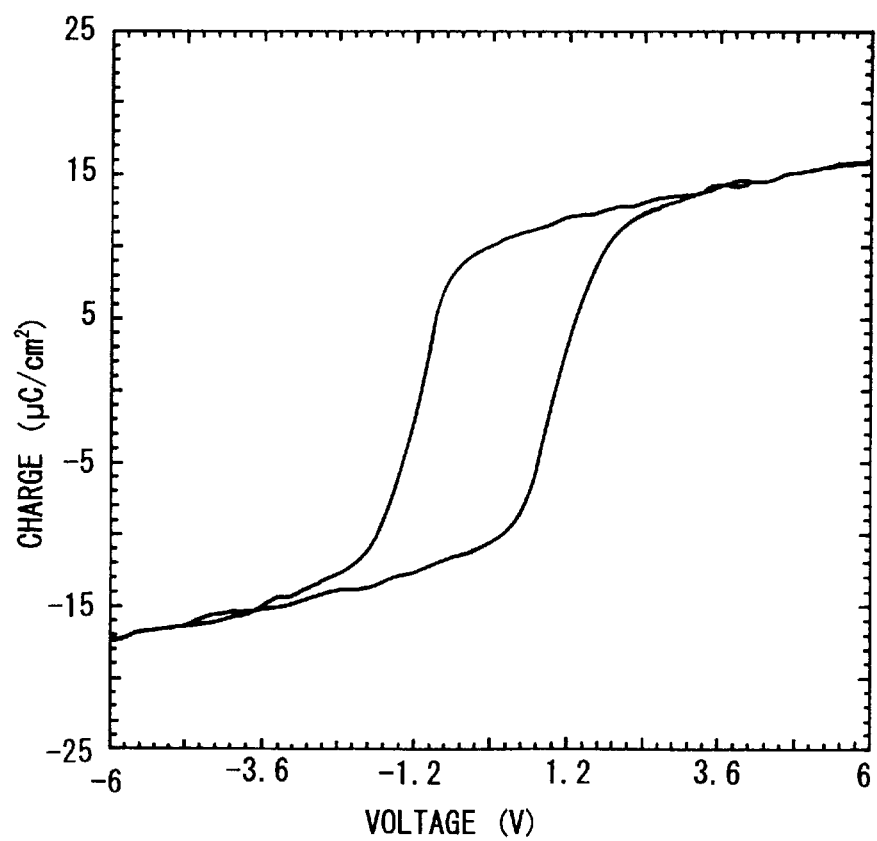
FIG. 11 is a schematic diagram showing a result of measurement of the amount of accumulated charge in the dielectric capacitor according to the first embodiment.

FIG. 11 shows a result of measurement of the amount of accumulated charge by applying a voltage between the Si substrate 1 and the Pt electrode 4 in the dielectric capacitor fabricated in the above-explained process. As shown in FIG. 11, that the value of residual polarization, an important factor of the ferroelectric memory, was $2P_r=20\,\mu C/cm^2$. The residual polarization value is a satisfactory value as SBT, and this was obtained by measurement through the Si substrate 1.

On the other hand, for comparison purposes, similar measurement was made on the amount of electric charge for another prepared sample using a multi-layered film stacking a Ti film and a TiN film instead of the $Pd_aRh_bO_c$ film 2 in FIG. 10. However, no polarization characteristics of the ferroelectric material was observed, and the sample did not work as a capacitor. Presumably, Si from the Si substrate 1 diffused, penetrating the multi-layered film from the Si substrate 1.

According to the first embodiment explained above, since the lower electrode is made of $Pd_aRh_bO_c$ film 2 having the composition within the range shown by the hatched portion in FIG. 9, Si of the Si substrate 1 can be prevented from thermally diffusing into the lower electrode even when the product is annealed at a high temperature around 800° C. in an oxygen atmosphere for crystallization of the SBT film 3, and it is prevented that the lower electrode loses the electric conductivity due to oxidation of Si along its upper surface. As a result, the dielectric capacitor can be used in a ferroelectric memory in which transistors and dielectric capacitors are arranged vertically so as to connect lower electrodes of the dielectric capacitors to diffusion layers of the transistors by poly-crystalline Si plugs, and therefore can use SBT films as dielectric films of the dielectric capacitors to realize high-integrated ferroelectric memory.

FIG. 12 shows a semiconductor integrated circuit device with a multi-layered wiring structure taken as a second embodiment of the invention.

As shown in FIG. 12, the semiconductor integrated circuit device according to the second embodiment has formed p-wells 12 and n-wells 13 in an n-type Si substrate 11. Recesses 14 are selectively formed in locations for device separating regions along the surface of the n-type Si substrate 11, and a field insulating film 15 made of $SiO_2$ is embedded in the recesses 14. A gate insulating film 16 made of $SiO_2$ is formed on the surface of the active region encircled by the field insulating film 15. Numeral 17 denotes an impurity-doped poly-crystalline Si film, and 18 denotes a metal silicide film such as $WSi_x$ film. These poly-crystalline Si film 17 and metal silicide film 18 form a polycide-structured gate electrode. A side wall spacer 19 made of $SiO_2$ is formed on side walls of the poly-crystalline Si film 17 and the metal silicide film 18. In the n-wells 13, $p^+$-type diffusion layers 20, 21 to be used as the source region or drain region are formed in self-alignment with the gate electrode made of the poly-crystalline Si film 17 and the metal silicide film 18. The gate electrode and the diffusion layers 20, 21 form a p-channel MOS transistor. Similarly, an n-channel MOS transistor is formed in each p-well 12. Numerals 22 and 23 denote $n^+$-type diffusion layers to be used as the source region or drain region of the n-channel MOS transistor.

An inter-layer insulating film 24, such as boro-phospho silicate glass (BPSG) film, is formed to cover the p-channel MOS transistor and the n-channel MOS transistor. The inter-layer insulating film 24 has formed via holes 25 and 26 in locations above the diffusion layer 21 of the p-channel MOS transistor and the gate electrode of the field insulating film 15. W pulgs 28 are embedded in the via holes 25 and 26 via a $Pd_aRh_bO_c$ film 27.

An Al—Cu alloy wiring 31 overlies the via holes 25, 26 via a $Pd_aRh_bO_c$ film 29 and a Ti film 30, and a Ti film 32 and a $Pd_aRh_bO_c$ film 33 are stacked thereon in sequence. Numeral 34 denotes an inter-layer insulating film, such as BPSG film. The inter-layer insulating film 34 has formed via holes 35 and 36 in locations above the Al—Cu alloy wiring 31. W plugs 38 are embedded in the via holes 35, 36 via a $Pd_aRh_bO_c$ film 37.

Further formed on the via holes 35, 36 are an Al—Cu alloy wiring 41 via a $Pd_aRh_bO_c$ film 39 and a Ti film 40, and a Ti film 42 and a $Pd_aRh_bO_c$ film 43 are formed thereon in sequence.

Composition of the $Pd_aRh_bO_c$ films 27, 29, 33, 37, 39 and 43 are chosen in the range shown by the hatched region in FIG. 9. The Ti films 30, 32 formed on and under the Al—Cu alloy wiring 31 are used to improve the adhesivity of the $Pd_aRh_bO_c$ films 29, 33 to the Al—Cu wiring 31. So is it also for the $Pd_aRh_bO_c$ films 39, 43 on and under the Al—Cu alloy wiring 41.

According to the second embodiment, since W plugs 28 are formed in the via holes 25, 26 via the $Pd_aRh_bO_c$ film 27 with a sufficiently higher heat resistance than TiN and TiNO films conventionally used as a barrier metal and therefore preventing diffusion of Si even under a high temperature, restriction on the processing temperature in steps subsequent to formation of the W plug 28 is alleviated than conventional technologies, and more freedom is allowed for choice of the process temperature and time in later steps. Additionally, since the $Pd_aRh_bO_c$ film 29 is formed between the W plug 28 and the overlying Al—Cu alloy wiring 31, and the $Pd_aRh_bO_c$ film 33 is formed between the Al—Cu alloy wiring 31 and the overlying W plug 38, diffusion between the W plugs 28, 38 and the Al—Cu alloy wiring 31 can be prevented. Similarly, the $Pd_aRh_bO_c$ film 39 formed between the W plug 38 and the overlying Al—Cu alloy wiring 41 prevents diffusion between them.

The semiconductor integrated circuit device according to the second embodiment is suitable for applications to various semiconductor integrated circuit devices, such as DRAM and MPU.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the first embodiment has been explained as using SBT as the material of the dielectric film of the dielectric capacitor; however, any appropriate other ferroelectric or high dielectric material can be used to form the dielectric material. Namely, PZT or BST may be used.

The second embodiment has been explained as interposing the Ti films 30 and 32 between the Al—Cu alloy wiring 31 and the $Pd_aRh_bO_c$ films 29, 33, respectively, and interposing the Ti films 40 and 42 between the Al—Cu alloy wiring 41 and the $Pd_aRh_bO_c$ films 39, 43, respectively. However, these Ti films 30, 32, 40, 42 may be omitted where appropriate.

As described above, according to the first and second aspects of the invention, an electronic material suitable for use as the material of the lower electrode or diffusion preventing layers of a dielectric capacitor can be provided.

According to the third aspect of the invention, a high-quality electronic material suitable for use as the material of the lower electrode or diffusion preventing layers of a dielectric capacitor can be manufactured easily.

According to the fourth and fifth aspects of the invention, in a structure arranging a transistor and a dielectric capacitor in a vertical alignment so as to connect the lower electrode of the dielectric capacitor to the diffusion layer of the transistor by a Si or W plug, diffusion of Si or W from the plug into the lower electrode can be prevented, which results in enabling the use of not only PZT but also SBT, which requires high-temperature annealing, as the material of the dielectric capacitor.

According to the six aspect of the invention, more freedom is allowed for choice of the processing temperature and time in a process after formation of the plug.

What is claimed is:

1. A dielectric capacitor comprising:
    a lower electrode made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, $a+b+c=100$, $100 > x \geq 0$, $100 > y \geq 0$, $100 > z \geq 0$, and $100 > x+y+z \geq 0$;
    a dielectric film on said lower electrode; and
    an upper electrode on said dielectric film.

2. The dielectric capacitor according to claim 1 wherein said material expressed by $Pd_a(Rh_{100-x-y-z}Pt_xIr_yRu_z)_bO_c$ satisfies the composition ratios of $60 \geq a \geq 30$, $30 \geq b \geq 15$, $50 \geq c \geq 30$, and $a+b+c=100$.

3. The dielectric capacitor according to claim 1 wherein said lower electrode is made of a material expressed by the composition formula $Pd_aRh_bO_c$ (where a, b and c are composition ratios in atomic %) in which the composition ratios satisfy $70 \geq a \geq 20$, $40 \geq b \geq 10$, $60 \geq c \geq 15$ and $a+b+c=100$).

4. The dielectric capacitor according to claim 1 wherein said lower electrode is formed by reactive sputtering using oxygen or water vapor.

5. The dielectric capacitor according to claim 1 wherein said dielectric film is made of a Bi layer-structured perovskite-type ferroelectric material.

6. The dielectric capacitor according to claim 1 wherein said dielectric film is made of a ferroelectric material in which at least 85% is occupied by a crystal layer expressed by $Bi_x(Sr, Ca, Ba)_y(Ta, Nb)_2O_z$ (where $2.50 \geq x \geq 1.70$, $1.20 \geq y \geq 0.60$, $z=9 \pm d$ and $1.0 \geq d \geq 0$).

7. The dielectric capacitor according to claim 1 wherein said dielectric film is made of a ferroelectric material in which at least 85% is occupied by a crystal layer expressed by $Bi_xSr_yTa_2O_z$ (where $2.50 \geq x \geq 1.70$, $1.20 \geq y \geq 0.60$, $z=9 \pm d$ and $1.0 \geq d \geq 0$).

8. The dielectric capacitor according to claim 1 wherein said dielectric film is made of a ferroelectric material expressed by $SrBi_2Ta_2O_9$.

9. The dielectric capacitor according to claim 1 wherein said dielectric film is made of a ferroelectric material expressed by $Pb(Zr, Ti)O_3$.

10. The dielectric capacitor according to claim 1 wherein said dielectric film is made of a high dielectric material expressed by $(Ba, Sr)TiO_3$.

11. Non-volatile memory including a transistor and a dielectric capacitor, said dielectric capacitor comprising:
    a lower electrode made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, $a+b+c=100$, $100 > x \geq 0$, $100 > y \geq 0$, $100 > z \geq 0$, and $100 > x+y+z \geq 0$;
    a dielectric film on said lower electrode; and
    an upper electrode on said dielectric film.

12. The nonvolatile memory according to claim 11 wherein said material expressed by $Pd_a(Rh_{100-x-y-z}Pt_xIr_yRu_z)_bO_c$ satisfy the composition ratios of $60 \geq a \geq 30$, $30 \geq b \geq 15$, $50 \geq c \geq 30$, and $a+b+c=100$.

13. The nonvolatile memory according to claim 11 wherein said lower electrode is made of a material expressed by the composition formula $Pd_aRh_bO_c$ (where a, b and c are composition ratios in atomic %) in which the composition ratios satisfy $70 \geq a \geq 20$, $40 \geq b \geq 10$, $60 \geq c \geq 15$ and $a+b+c=100$).

14. The nonvolatile memory according to claim 11 wherein said lower electrode is formed by reactive sputtering using oxygen or water vapor.

15. The nonvolatile memory according to claim 11 wherein said dielectric film is made of a Bi layer-structured perovskite-type ferroelectric material.

16. The nonvolatile memory according to claim 11 wherein said dielectric film is made of a ferroelectric material in which at least 85% is occupied by a crystal layer expressed by $Bi_x(Sr, Ca, Ba)_y(Ta, Nb)_2O_z$ (where $2.50 \geq x \geq 1.70$, $1.20 \geq y \geq 0.60$, $z=9 \pm d$ and $1.0 \geq d \geq 0$).

17. The nonvolatile memory according to claim 11 wherein said dielectric film is made of a ferroelectric material in which at least 85% is occupied by a crystal layer expressed by $Bi_xSr_yTa_2O_z$ (where $2.50 \geq x \geq 1.70$, $1.20 \geq y \geq 0.60$, $z=9 \pm d$ and $1.0 \geq d \geq 0$).

18. The nonvolatile memory according to claim 11 wherein said dielectric film is made of a ferroelectric material expressed by $SrBi_2Ta_2O_9$.

19. The nonvolatile memory according to claim 11 wherein said dielectric film is made of a ferroelectric material expressed by $Pb(Zr, Ti)O_3$.

20. The nonvolatile memory according to claim 11 wherein said dielectric film is made of a high dielectric material expressed by $(Ba, Sr)TiO_3$.

21. The nonvolatile memory according to claim 11 wherein said lower electrode is formed on a plug made of Si or W formed on a diffusion layer of said transistor.

22. A semiconductor device including a first conductive layer and a second conductive layer on said first conductive layer, comprising:
    a diffusion preventing layer interposed between said first conductive layer and said second conductive layer and made of a material expressed by the composition formula $Pd_a(Rh_{100-x-y-z}Pt_xIr_yRu_z)_bO_c$ (where a, b, c, x, y and z are composition ratios in atomic %) in which the composition ratios satisfy $70 \geq a \geq 20$, $40 \geq b \geq 10$, $60 \geq c \geq 15$, $a+b+c=100$, $100 > x \geq 0$, $100 > y \geq 0$, $100 > z \geq 0$, and $100 > x+y+z \geq 0$.

23. The semiconductor device according to claim 22 wherein said diffusion preventing layer is made of a material expressed by the composition formula $Pd_aRh_bO_c$ (where a, b and c are composition ratios in atomic %) in which the composition ratios satisfy $70 \geq a \geq 20$, $40 \geq b \geq 10$, $60 \geq c \geq 15$ and $a+b+c=100$.

24. The semiconductor device according to claim 22 wherein said first conductive layer is a diffusion layer made of Si, and said second conductive layer is a plug made of an electrically conductive material.

25. The semiconductor device according to claim 24 wherein said plug is made of Si, W or Al.

26. The semiconductor device according to claim 22 wherein said first conductive layer is a plug made of an electrically conductive material, and said second conductive layer is an Al alloy wiring.

27. The semiconductor device according to claim 26 wherein said plug is made of Si, W or Al.

28. The semiconductor device according to claim 22 wherein said first conductive layer is an Al alloy wiring, and said second conductive layer is a plug made of an electrically conductive material.

29. The semiconductor device according to claim 28 wherein said plug is made of Si, W or Al.

* * * * *